(12) United States Patent
Kurosaki et al.

(10) Patent No.: US 10,236,373 B2
(45) Date of Patent: Mar. 19, 2019

(54) SEMICONDUCTOR DEVICE AND PRODUCTION METHOD THEREFOR

(71) Applicant: TOYODA GOSEI CO., LTD., Kiyosu-shi (JP)

(72) Inventors: Junichiro Kurosaki, Kiyosu (JP); Tohru Oka, Kiyosu (JP); Junya Nishii, Kiyosu (JP); Tsutomu Ina, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/647,041

(22) Filed: Jul. 11, 2017

(65) Prior Publication Data

US 2018/0026131 A1  Jan. 25, 2018

(30) Foreign Application Priority Data

Jul. 19, 2016 (JP) .................. 2016-141726

(51) Int. Cl.
*H01L 29/78* (2006.01)
*H01L 21/306* (2006.01)
(Continued)

(52) U.S. Cl.
CPC ........ *H01L 29/7813* (2013.01); *H01L 21/205* (2013.01); *H01L 21/306* (2013.01); *H01L 29/12* (2013.01); *H01L 29/41766* (2013.01); *H01L 29/517* (2013.01); *H01L 29/66348* (2013.01); *H01L 29/66712* (2013.01); *H01L 29/66727* (2013.01); *H01L 29/66734* (2013.01); *H01L 29/7397* (2013.01); *H01L 29/7802* (2013.01);
(Continued)

(58) Field of Classification Search
CPC ..... H01L 21/205; H01L 21/306; H01L 29/12; H01L 29/2003; H01L 29/7813; H01L 29/7827; H01L 29/786
See application file for complete search history.

(56) References Cited

U.S. PATENT DOCUMENTS 5,523,865 A * 6/1996 Furuta ................... G02F 1/1368
349/138
8,766,276 B2 * 7/2014 Tanaka ................ H01L 29/2003
257/76
(Continued)

FOREIGN PATENT DOCUMENTS

JP  2008-198787 A  8/2008
WO  WO 2008/099852 A1  8/2008

*Primary Examiner* — Syed I Gheyas
(74) *Attorney, Agent, or Firm* — McGinn IP Law Group, PLLC (57) ABSTRACT

To suppress current leakage in a semiconductor device having a gate insulating film and a gate electrode. A gate electrode is continuously formed in a film via a gate insulating film on the bottom surface of a trench, the side surfaces of a trench, and the top surfaces of a second n-type layer in the vicinity of the side surfaces of the trench. The ends of the bottom surface of the gate electrode are aligned with the ends of the top surface of the gate insulating film, and the ends of the bottom surface of the gate insulating film are formed in contact with the surfaces of the second n-type layer facing the ends of the bottom surface of the gate electrode. The passivation film covers the entire top surface of the device except the contact holes of the gate electrode and the source electrode.

16 Claims, 9 Drawing Sheets

(51) Int. Cl.
    *H01L 29/786*     (2006.01)
    *H01L 21/205*     (2006.01)
    *H01L 29/12*     (2006.01)
    *H01L 29/51*     (2006.01)
    *H01L 29/417*     (2006.01)
    *H01L 29/66*     (2006.01)
    *H01L 29/739*     (2006.01)
    *H01L 29/20*     (2006.01)
    *H01L 29/16*     (2006.01)

(52) U.S. Cl.
    CPC ........ *H01L 29/786* (2013.01); *H01L 29/7827* (2013.01); *H01L 29/1608* (2013.01); *H01L 29/2003* (2013.01); *H01L 29/513* (2013.01)

(56) References Cited

U.S. PATENT DOCUMENTS

| | | | |
|---|---|---|---|
| 9,070,705 B2 * | 6/2015 | Banerjee | H01L 29/66431 |
| 9,306,027 B2 * | 4/2016 | Inoue | H01L 29/4236 |
| 2007/0257289 A1 * | 11/2007 | Yang | H01L 27/1214 |
| | | | 257/296 |
| 2017/0301765 A1 * | 10/2017 | Tsuchiya | H01L 29/78 |

* cited by examiner

SEMICONDUCTOR DEVICE AND PRODUCTION METHOD THEREFOR

BACKGROUND OF THE INVENTION

Field of the Invention

The present invention relates to a semiconductor device having a gate insulating film and a gate electrode, and a production method therefor.

Background Art

In a semiconductor device using Group III nitride semiconductor such as GaN, a surface level is formed on a surface of a semiconductor layer due to etching damage. The surface level causes current leakage. Therefore, current leakage is suppressed by covering the exposed surface of the semiconductor layer except a region having a gate insulating film or an electrode thereon with a passivation film.

Japanese Patent Application Laid-Open (kokai) No. 2008-198787 describes that a material different from the material of the gate insulating film is used as a passivation film. Thus, a material more suitable for suppressing current leakage may be used.

However, in the above case, the passivation film in the vicinity of the ends of the gate electrode is formed via the gate insulating film. The effect of suppressing current leakage is not sufficiently achieved only by using a material different from the material of the gate insulating film as a passivation film. Further suppression of current leakage is required.

SUMMARY OF THE INVENTION

In view of the foregoing, an object of the present invention is to suppress current leakage in a semiconductor device having a gate electrode and a gate insulating film.

The present invention is a semiconductor device comprising a semiconductor layer, a gate insulating film formed on a part of the surface of the semiconductor layer, a gate electrode formed via the gate insulating film on the surface of the semiconductor layer, an electrode formed apart from the gate electrode on a part of the surface of the semiconductor layer, and a passivation film formed in contact with a region other than a region having the gate insulating film and the electrode thereon of the surface of the semiconductor layer and made of an insulating material different from the material of the gate insulating film, wherein the ends of the top surface of the gate insulating film are in contact with the bottom surface of the gate electrode, and the side surfaces at the ends of the gate insulating film are in a range of −60° to 60° with respect to a direction perpendicular to the surface in contact with the bottom surface at the ends of the gate insulating film of the semiconductor layer.

In the present invention, the following constitution is preferably used. The first one is that the passivation film is made of a material having a dielectric constant higher than the material of the gate insulating film.

The second one is that the passivation film is made of a material having a dielectric constant lower than that of the gate insulating film.

The third one is that the ends of the bottom surface of the gate insulating film are disposed inside the ends of the bottom surface of the gate electrode.

The fourth one is that the area outside a channel of the surface of the gate insulating film in contact with the semiconductor layer is 90% or less of the area where the gate electrode faces the semiconductor layer via the gate insulating film and the passivation film of the area where the semiconductor layer is in contact with the gate insulating film and the passivation film. As used herein, channel refers to a part where carriers are controlled in the semiconductor layer, for example, a p-type layer of semiconductor layer in a FET having an npn structure.

In the present invention, the passivation film may be made of any material different from the material of the gate insulating film. More specifically, the gate insulating film is preferably made of $SiO_2$ because it has a high insulation strength and easy film formation and processing properties. When the gate insulating film is made of $SiO_2$ and the passivation film is made of a material having a dielectric constant higher than the material of the gate insulating film, the passivation film is preferably made of $Al_2O_3$, ZrON, AlON, $ZrO_2$, $HfO_2$ or HfON. When the passivation film is made of a material having a dielectric constant lower than the material of the gate insulating film, the passivation film is preferably made of SiOF or SiOC. Moreover, the passivation film is preferably made of a material having a negative fixed charge, for example, $Al_2O_3$ because the electrons are excluded from the surface of the semiconductor layer, and current leakage is further reduced by using such a material.

The semiconductor device of the present invention may have various conventional structures. However, the present invention is preferably applied to a trench gate structure in which the surface of the semiconductor layer has a trench, and the gate insulating film is formed on the side surfaces or the bottom surface of the trench, or a vertical structure in which electrical conduction is established with respect to a direction perpendicular to the main surface of the semiconductor layer. In the present invention, the surface of the semiconductor layer in contact with the bottom surface at the ends of the gate insulating film is, for example, the bottom surface of the trench when the ends of the gate insulating film are on the bottom surface of the trench, the side surfaces of the trench when the ends of the gate insulating film are on the side surfaces of the trench, and the top surfaces of the trench when the ends of the gate insulating film are on the top surfaces of the trench.

The semiconductor layer of the present invention may be made of any semiconductor material. The present invention is preferably applied to when Group III nitride semiconductor or SiC providing high breakdown voltage is used, and more preferably applied to when Group III nitride semiconductor is used.

The present invention is a method for producing a semiconductor device comprising a semiconductor layer, a gate insulating film formed on a part of the surface of the semiconductor layer, a gate electrode formed via the gate insulating film on the surface of the semiconductor layer, an electrode formed apart from the gate electrode on a part of the surface of the semiconductor layer, and a passivation film formed in contact with a region other than the region having the gate insulating film and the electrode thereon of the surface of the semiconductor layer and made of an insulating material different from the material of the gate insulating film, the production method comprising forming the gate insulating film on the surface of the semiconductor layer, forming the gate electrode on a predetermined region on the gate insulating film using a mask, etching the gate insulating film while leaving the mask so that the ends of the top surface of the gate insulating film are in contact with the bottom surface of the gate electrode, and so that the side surfaces at the ends of the gate insulating film are in a range of −60° to 60° with respect to a direction perpendicular to the surface in contact with the bottom surface at the ends of the gate insulating film of the semiconductor layer.

By the above-mentioned production method of the present invention, the gate insulating film can be etched in a self-matching manner, and the ends of the top surface of the gate insulating film are easily to be in contact with the bottom surface of the gate electrode.

In etching the gate insulating film, the gate insulating film may be etched so that the ends of the top surface of the gate insulating film are in contact with the ends of the bottom surface of the gate electrode or the bottom surface of the gate electrode, and so that the ends of the bottom surface of the gate insulating film are disposed outside the ends of the bottom surface of the gate electrode.

In etching the gate insulating film, the gate insulating film may be etched so that the ends of the top surface of the gate insulating film are in contact with the ends of the bottom surface of the gate electrode or the bottom surface of the gate electrode, and so that the ends of the bottom surface of the gate insulating film are disposed inside the ends of the bottom surface of the gate electrode.

The mask is a resist mask. In etching the gate insulating film, the gate insulating film may be etched by dry etching using fluorine based gas.

The mask is a resist mask. In etching the gate insulating film, the gate insulating film may be etched by wet etching using hydrofluoric acid.

The passivation film is preferably formed through Atomic Layer Deposition (ALD).

According to the present invention, the area where the passivation film is in contact with the surface of the semiconductor layer is increased, thereby further suppressing current leakage caused by the surface level generated on the surface of the semiconductor layer.

More specifically, when the ends of the top surface of the gate insulating film are aligned with the ends of the bottom surface of the gate electrode or the bottom surface of the gate electrode, and the passivation film has a dielectric constant higher than that of the gate insulating film, electric field concentration is reduced at the ends of the bottom surface of the gate electrode, thereby reducing the deterioration of device characteristics and improving the service life.

Moreover, when the ends of the top surface of the gate insulating film are in contact with the ends of the bottom surface of the gate electrode or the bottom surface of the gate electrode, the ends of the bottom surface of the gate insulating film are disposed inside the ends of the bottom surface of the gate electrode, and the passivation film has a dielectric constant lower than that of the gate insulating film, electric field concentration is reduced at the ends of the bottom surface of the gate electrode, thereby reducing the deterioration of device characteristics and improving the service life.

In etching the gate insulating film, the production process can be simplified by etching the gate insulating film in a self-matching manner while leaving the mask used in etching the gate electrode.

The mask is a resist mask. In etching the gate insulating film etching, the gate insulating film may be etched by dry etching using a fluorine based gas.

In etching the gate insulating film, the gate insulating film may be etched by wet etching using a hydrofluoric acid.

The passivation film is formed through ALD so that an amorphous film having superior step covering property and uniform thickness and quality, is obtained. Therefore, even if the ends of the gate insulating film are disposed inside the ends of the gate electrode, the passivation film can be accurately formed in a gap between the ends of the gate electrode and the semiconductor layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
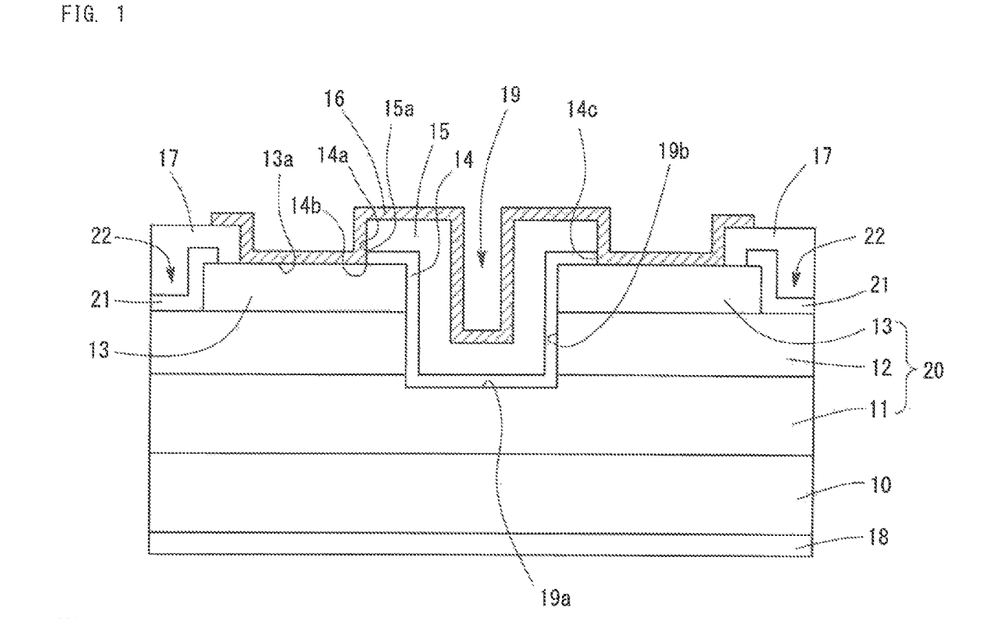
FIG. 1 shows the structure of a semiconductor device according to Embodiment 1.

FIG. 1 shows the structure of a semiconductor device according to Embodiment 1. The semiconductor device according to Embodiment 1 has a vertical type structure in which electrical conduction is established with respect to a direction perpendicular to the main surface of the substrate. The device is a MOSFET in which the gate has a trench gate structure. As shown in FIG. 1, the semiconductor device according to Embodiment 1 comprises a substrate 10, a semiconductor layer 20 disposed on the substrate 10, a gate insulating film 14, a gate electrode 15, a passivation film 16, a source electrode 17, a drain electrode 18, a p-body electrode 21, a trench 19, and a recess 22. The semiconductor layer 20 has a layered structure of a first n-type layer 11, a p-type layer 12, and a second n-type layer 13 being sequentially deposited.

FIG. 1 shows a cross section of the structure of one unit cell of the semiconductor device, and the entire device has a structure in which regular hexagonal unit cells are arranged in a honeycomb pattern and connected in parallel. More specifically, the plane pattern of the trench 19 is a pattern corresponding to the sides of the regular hexagon in the above honeycomb pattern, in which the source electrode 17 and the p-body electrode 21 are disposed at the center of the regular hexagon. Needless to say, the unit cell pattern and the unit cell arrangement pattern are not limited to this. Any pattern may be employed. However, the above honeycomb pattern is advantageous in plane filling rate or reduction of on resistance.

The substrate 10 is a planar substrate made of Si-doped c-plane n-GaN having a thickness of 300 µm. The Si concentration is $1\times10^{18}$/cm$^3$. Any material with conductivity other than n-GaN may be used as Group III nitride semiconductor growth substrate. For example, ZnO, Si, SiC, and others may be used. However, in terms of lattice matching, a GaN substrate is preferably used as in the present embodiment.

The first n-type layer 11 is an n-GaN layer deposited on the substrate 10, which has a thickness of 10 µm and is doped with Si at a concentration of $1\times10^{16}$/cm$^3$.

The p-type layer 12 is a p-GaN layer deposited on the n-type layer 11, which has a thickness of 1.0 µm and is doped with Mg at a concentration of $2\times10^{18}$/cm$^3$.

The second n-type layer 13 is an n-GaN layer deposited on the p-type layer 12, which has a thickness of 0.3 µm and is doped with Si at a concentration of $3\times10^{18}$/cm$^3$. A part of the second n-type layer 13 (the region for forming the p-body electrode 21 and the source electrode 17) is removed by etching, and a recess 22 is formed, thus exposing the p-type layer 12 on the bottom of the recess.

The trench 19 is a trench formed at a predetermined position of the semiconductor layer 20 so as to have a thickness passing through the second n-type layer 13 and the p-type layer 12 and reaching the first n-type layer 11. On the bottom surface 19a of the trench 19, the first n-type layer 11 is exposed, and on the side surfaces 19b of the trench 19, the first n-type layer 11, the p-type layer 12, and the second n-type layer 13 are exposed.

The trench 19 may have any shape. The side surfaces 19b of the trench 19 are not be necessarily perpendicular to the main surface of the substrate 10, and may be inclined.

The gate insulating film 14 is continuously formed in a film on the bottom surface 19a of the trench 19, the side surfaces 19b of the trench 19, and the top surfaces of the trench 19 (the top surfaces 13a of the second n-type layer 13 in the vicinity of the side surfaces 19b of the trench 19). The ends 14a of the top surface of the gate insulating film 14 (the surfaces in contact with the gate electrode 15) are formed aligned with the ends 15a of the bottom surface of the gate electrode 15 (the surfaces in contact with at least a part of the gate insulating film 14). Moreover, the ends 14b of the bottom surface of the gate insulating film 14 (the surface in contact with the second n-type layer 13) are formed in contact with the surfaces of the second n-type layer 13 facing the ends 15a of the bottom surface of the gate electrode 15, and the side surfaces 14c at the ends of the gate insulating film 14 are perpendicular to the top surfaces 13a of the second n-type layer 13 (the top surfaces of the trench 19) in contact with the bottom surface at the ends of the gate insulating film 14. The gate insulating film 14 is made of SiO$_2$ and has a thickness of 100 nm.

The gate electrode 15 is continuously formed in a film via the gate insulating film 14 on the bottom surface 19a of the trench 19 and the side surfaces 19b of the trench 19, and the top surfaces 13a of the second n-type layer 13 in the vicinity of the side surfaces 19b of the trench 19. The gate electrode 15 is made of Al.

As shown in FIG. 1, the ends 15a of the bottom surface of the gate electrode 15 are aligned with the ends 14a of the top surface of the gate insulating film 14. The ends 14b of the bottom surface of the gate insulating film 14 is formed in contact with the surfaces of the second n-type layer 13 facing the ends 15a of the bottom surface of the gate electrode 15. Therefore, the area where the gate insulating film 14 is in contact with the second n-type layer 13 is equal to the area where the gate electrode 15 faces the second n-type layer 13 via the gate insulating film 14.

The passivation film 16 covers the entire top surface of the device except the contact hole of the source electrode 17. More specifically, the passivation film 16 is continuously formed in a film on the top surface of the source electrode 17 (except the contact hole), the exposed surface of the second n-type layer 13 (the top surfaces 13a of the second n-type layer 13 excluding the region where the source electrode 17, the p-body electrode 21, and the gate insulating film 14 are formed), the side surfaces 14c at the ends of the gate insulating film 14, and the gate electrode 15. The passivation film 16 has a uniform thickness, and the thickness is 100 nm. The passivation film 16 is covered with a protective film (not illustrated) except the contact hole of the source electrode 17.

The passivation film 16 is made of Al$_2$O$_3$. Any insulating material having a dielectric constant higher than that of the gate insulating film 14 may be used. Other than Al$_2$O$_3$, for example, ZrON, SiON, HfO$_2$, SiN, AlON, AlN, and others may be used. Particularly, Al$_2$O$_3$ and ZrON are preferably used in terms of easy formation, high film quality, and high dielectric constant. As a material of the passivation film 16, a material having negative fixed charge, for example, Al$_2$O$_3$ is preferably used. When the material having negative fixed charge is used, electrons are excluded from the surface of the semiconductor layer, thereby reducing more current leakage. The passivation film 16 may have a multi-layer structure. In that case, dielectric constant of the passivation film 16 means an effective dielectric constant of the entire multi-layer of the passivation film. The multi-layer structure of the passivation film 16 includes, for example, Al$_2$O$_3$/ZrON, and Al$_2$O$_3$/HfO$_2$.

The passivation film 16 is preferably a film formed through ALD. Through ALD, an amorphous film having uniform quality and good covering property can be obtained.

In the semiconductor device according to Embodiment 1, the ends 14b of the bottom surface of the gate insulating film 14 are formed in contact with the surfaces of the second n-type layer 13 facing the bottom surface of the gate electrode 15. The exposed surface of the second n-type layer 13 (the top surfaces 13a of the second n-type layer 13 excluding the region where the source electrode 17, the p-body electrode 21, and the gate insulating film 14 are formed) can be obtained larger than in the conventional one. Therefore, compared to the structure where the ends 14b of the bottom surface of the gate insulating film 14 are disposed outside the ends 15a of the bottom surface of the gate electrode 15, the contact area between the second n-type layer 13 and the gate insulating film 14 is decreased and on the contrary, the contact area between the second n-type layer 13 and the passivation film 16 is increased. The effect of suppressing current leakage caused by the surface level generated on the surface of the second n-type layer 13 is higher in the passivation film 16 than in the gate insulating film 14, thereby reducing more current leakage with the increase of the contact area.

Since the passivation film 16 is made of a material having a dielectric constant higher than that of the gate insulating film 14, the electric field concentration is reduced at the ends 15a of the bottom surface of the gate electrode 15. This is because the passivation film 16 is in contact with the gate electrode 15 at the ends 15a of the bottom surface so that the electric field distribution is gradually changed from the ends 15a of the bottom surface of the gate electrode 15 to the passivation film 16. As a result that the electric field concentration is reduced, the characteristic deterioration of the semiconductor device according to Embodiment 1 is reduced, thereby improving the service life of the semiconductor device.

To reduce more current leakage, and to reduce the electric field concentration at the ends 15a of the bottom surface of the gate electrode 15, the dielectric constant of the passivation film 16 is preferably as higher as possible than the dielectric constant of the gate insulating film 14. The dielectric constant of the passivation film 16 is preferably 4 to 5,000, more preferably, 4 to 100, and further preferably, 4 to 30.

For the same reason, the thickness of the passivation film 16 is preferably 10 nm to 10,000 nm, more preferably, 30 nm to 2,000 nm, and further preferably, 50 nm to 1,000 nm.

The passivation film 16 may be made of a material having a dielectric constant lower than that of the gate insulating film 14. In this case, the effect of reducing the electric field concentration at the ends 15a of the bottom surface of the gate electrode 15 is not achieved. However, the effect of reducing more current leakage with the increase of the contact area between the passivation film 16 and the second n-type layer 13 can be achieved.

The p-body electrode 21 is continuously formed on a part of the second n-type layer 13 and the p-type layer 12 exposed by the recess 22. The p-body electrode 21 is made of Pd.

The source electrode 17 is continuously formed over the p-body electrode 21 and a part of the second n-type layer 13. The source electrode 17 is made of a conductive material establishing ohmic contact with the second n-type layer 13, and having a layered structure of Ti/Al. Ti/Al/Ni/Au, TiN/Al, Pd/Ti/Al, Ti/Al/Pd, and others may be used.

The drain electrode 18 is formed in contact with the rear surface of the substrate 10 (the surface opposite to the side where the first n-type layer 11 is formed). The drain electrode 18 is made of a conductive material establishing ohmic contact with the substrate 10, which is the same material of the source electrode 17. Needless to say, so long as ohmic contact is established, different materials may be used between the source electrode 17 and the drain electrode 18.

Next will be described the method for producing the semiconductor device according to Embodiment 1 with reference to FIG. 2.

Figure 2A:
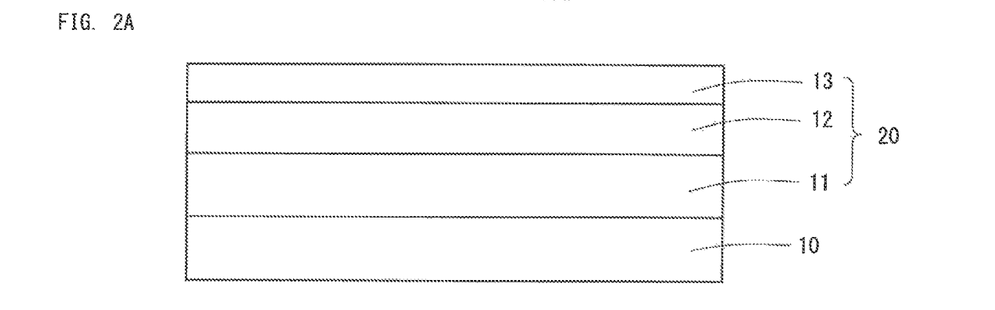
FIGS. 2A to 2G are sketches showing processes for producing the semiconductor device according to Embodiment 1.

Firstly, a semiconductor layer 20 is formed by sequentially depositing a first n-type layer 11, a p-type layer 12, and a second n-type layer 13 through MOCVD on a substrate 10 (refer to FIG. 2A). In MOCVD, ammonia gas ($NH_3$) is used as a nitrogen source, trimethylgallium ($Ga(CH_3)_3$: TMG) is used as a gallium source, and trimethylaluminum ($Al(CH_3)_3$: TMA) is used as an aluminum source. Silane ($SiH_4$) is used as an n-type dopant gas, and bis(cyclopentadienyl)magnesium ($Mg(C_5H_5)_2$: $CP_2Mg$) is used as a p-type dopant gas. The carrier gas is hydrogen gas ($H_2$) or nitrogen gas ($N_2$).

Figure 2B:
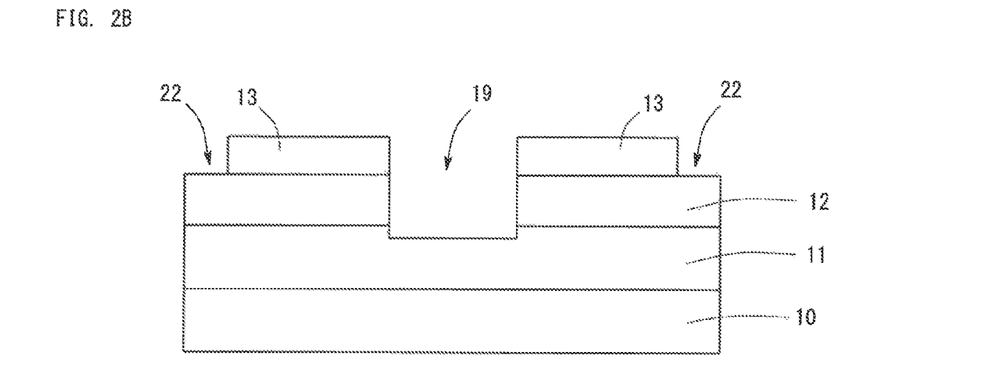
Figure 2C:
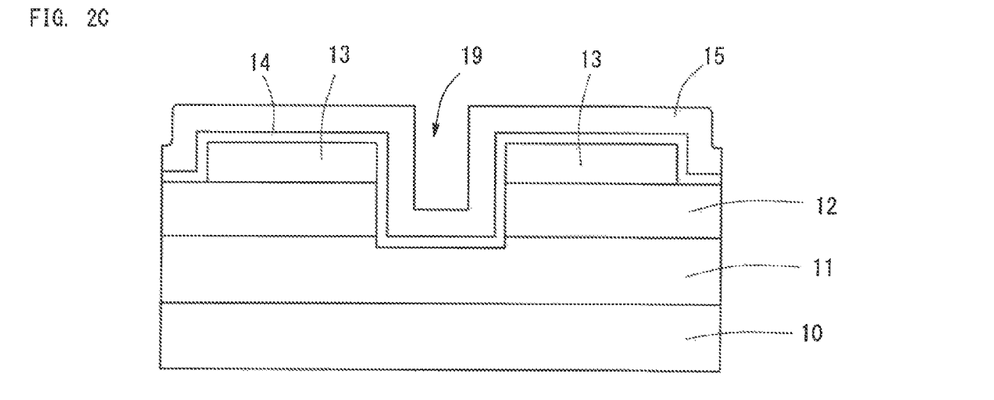
Figure 2D:
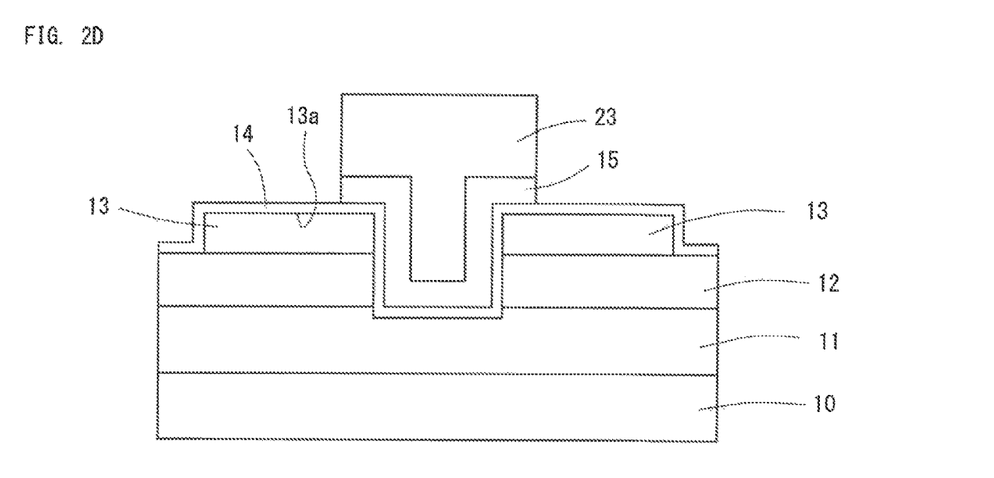

Subsequently, a trench 19 and a recess 22 are formed by dry etching at a predetermined position of the semiconductor layer 20 (refer to FIG. 2B). The trench 19 is formed by dry etching until the second n-type layer 13 and the p-type layer 12 are passed through and the first n-type layer 11 is exposed. The recess 22 is formed by dry etching until the p-type layer 12 is exposed. Either of the trench 19 and the recess 22 may be formed first. Through dry etching, a damaged layer is formed on the side surfaces 19b of the trench 19 or the side surfaces of the recess 22. The damaged layer may be removed by wet etching. This can reduce current leakage via the side surfaces. In this case, wet etching solution may be TMAH (tetramethyl ammonium hydroxide).

Next, a gate insulating film 14 made of $SiO_2$ is formed through ALD on the entire top surface of the semiconductor layer 20. Subsequently, a gate electrode 15 made of Al is formed by sputtering on the entire top surface of the gate insulating film 14 (refer to FIG. 2C). In ALD, ozone or oxygen plasma may be used as an oxygen source. The gate insulating film 14 can be grown at a lower temperature, and uniform film thickness and higher film quality can be achieved. In the case where a passivation film 16 is formed through ALD as described later, ozone or oxygen plasma may be used in the same way. The gate insulating film 14 may be formed through CVD or by sputtering instead of ALD.

Subsequently, a resist mask 23 is formed by photolithography in a region above the gate electrode 15 and the trench 19. After that, the gate electrode 15 is removed by dry etching a region except the region just below the resist mask 23 (refer to FIG. 2D). The etching gas is, for example, chlorine based gas. Thus, the gate electrode 15 remains in a continuous film via the gate insulating film 14 on the bottom surface 19a of the trench 19, the side surfaces 19b of the trench 19, and the top surfaces 13a of the second n-type layer 13 in the vicinity of the side surfaces 19b of the trench 19.

Figure 2E:
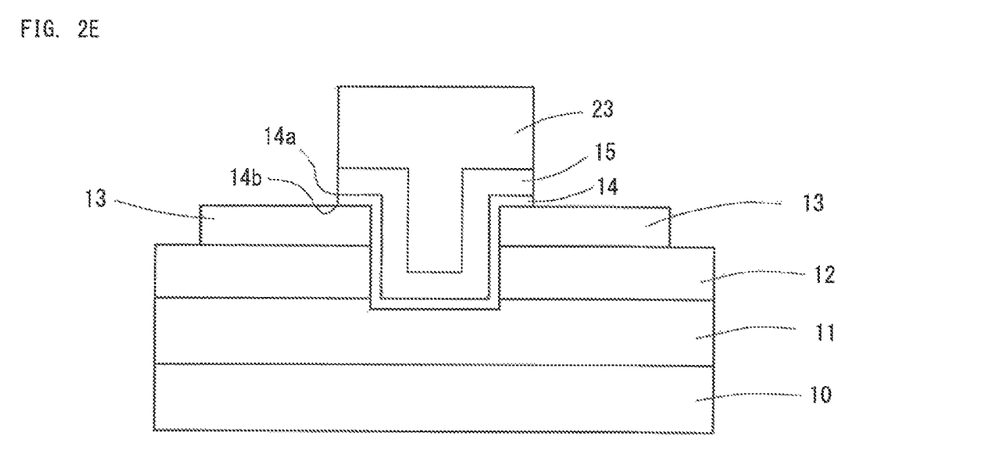
Figure 2F:
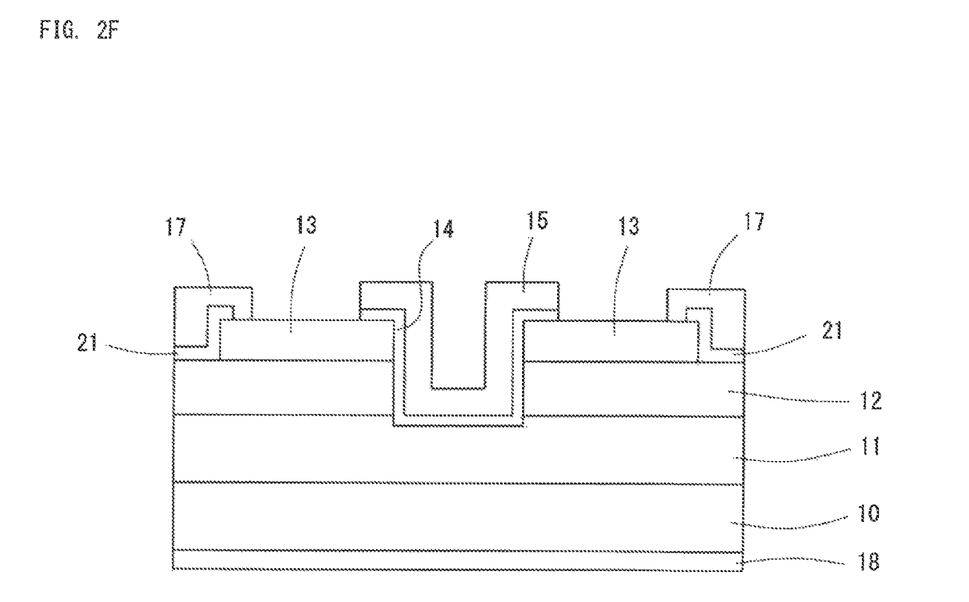

Then, the gate insulating film 14 is removed by dry etching except a region just below the resist mask 23 while leaving the resist mask 23 (FIG. 2E). The etching gas is, for example, fluorine based gas or chlorine based gas. Fluorine based gas is preferably used. This allows easier etching of the gate insulating film 14. The gate insulating film 14 may be removed by wet etching instead of dry etching. In this case, the wet etching solution is, for example, hydrofluoric acid or buffered hydrogen fluoride. Hydrofluoric acid solution is preferably used. This allows easier etching of the gate insulating film 14.

By etching, the gate insulating film 14 remains in a continuous form on the bottom surface 19a of the trench 19, the side surfaces 19b of the trench 19, and the top surfaces 13a of the second n-type layer 13 in the vicinity of the side surfaces 19b of the trench 19. Moreover, the ends 14a of the top surface of the gate insulating film 14 are formed aligned with the ends 15a of the bottom surface of the gate electrode 15. The ends 14b of the bottom surface of the gate insulating film 14 are formed in contact with the surfaces of the second n-type layer 13 facing the bottom surface of the gate electrode 15. Thus, the gate insulating film 14 can be etched in a self-alignment manner, thereby simplifying the production process. After that, the resist mask 23 is removed.

A mask for patterning the gate insulating film 14 and the gate electrode 15 is a resist mask in Embodiment 1. However, any material other than resist may be used so long as it has resistance to etching the gate insulating film 14 and the gate electrode 15. Using a resist mask as in Embodiment 1 is simple and preferable.

Subsequently, a p-body electrode 21, and a source electrode 17 are sequentially formed using lift-off techniques. A drain electrode 18 is formed using lift-off techniques on the rear surface of the substrate 10 (refer to FIGS. 1 and 2F). The drain electrode 18 may be formed before the formation of the p-body electrode 21. After the formation of the source electrode 17, the gate insulating film 14 and the gate electrode 15 may be sequentially formed.

Figure 2G:
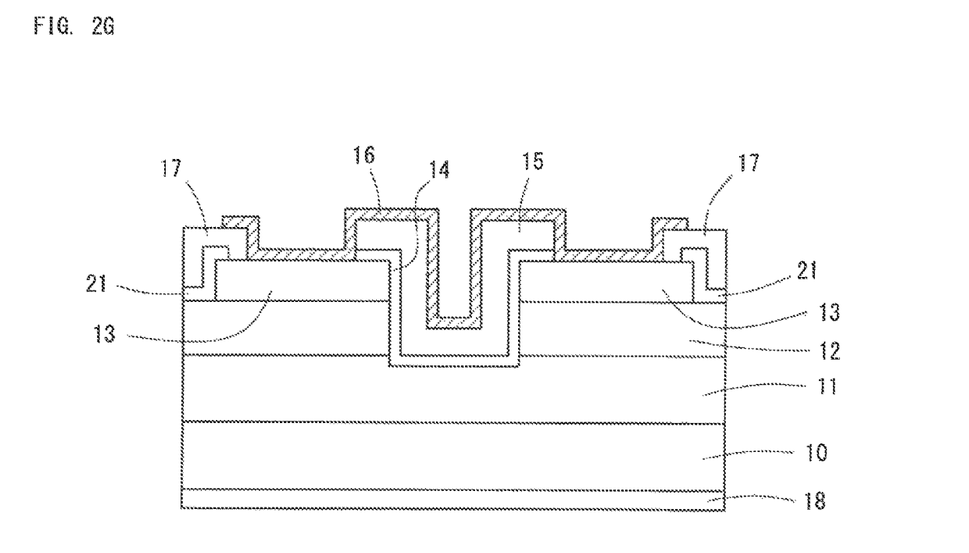

Through ALD (Atomic Layer Deposition), the passivation film 16 made of $Al_2O_3$ is formed so as to cover the entire top surface, that is, the top surface of the gate electrode 15, the side surfaces at the ends of the gate electrode 15, the side surfaces 14c at the ends of the gate insulating film 14, the second n-type layer 13, the side surfaces at the ends of the source electrode 17, and the top surface of the source electrode 17 (refer to FIGS. 1 and 2G). ALD is superior in step covering property and film thickness controllability. Therefore, an amorphous passivation film 16 having uniform thickness and uniform quality can be formed with high reproducibility. The exposed surface of the second n-type layer 13 is covered in contact with amorphous $Al_2O_3$ having uniform thickness and uniform quality, thereby effectively suppressing current leakage caused by the surface level generated on the surface of the second n-type layer 13. The passivation film 16 may be formed through CVD or by sputtering instead of ALD. An oxynitride film may be formed by nitriding after the formation of oxide film or oxidizing after the formation of nitride film.

Subsequently, a protective film (not illustrated) is formed so as to cover the passivation film 16, a region above the source electrode 17 of the passivation film 16 and the protective film is dry etched to form a contact hole, and a wiring electrode (not illustrated) being connected to the source electrode 17 is formed. In this way, the semiconductor device according to Embodiment 1 is produced.

The effects of the semiconductor device according to Embodiment 1 are summarized below. Firstly, the ends 14a of the top surface of the gate insulating film 14 are formed aligned with the ends 15a of the bottom surface of the gate electrode 15, and the ends 14b of the bottom surface of the gate insulating film 14 are formed in contact with the surfaces of the second n-type layer 13 facing the bottom surface of the gate electrode 15. The area where the passivation film 16 is in contact with the top surfaces 13a of the second n-type layer 13 is increased compared to the case where the ends 14b of the bottom surface of the gate insulating film 14 are formed outside the gate electrode 15. Thereby, current leakage caused by the surface level generated on the surface of the second n-type layer 13 is suppressed. Secondly, since the passivation film 16 is made of a material having a dielectric constant higher than that of the gate insulating film 14, the electric field concentration is reduced at the ends 15a of the bottom surface of the gate electrode 15. As a result, the deterioration of device characteristic is reduced, thereby improving the service life of the device.

Variation 1 of Embodiment 1

Figure 3:
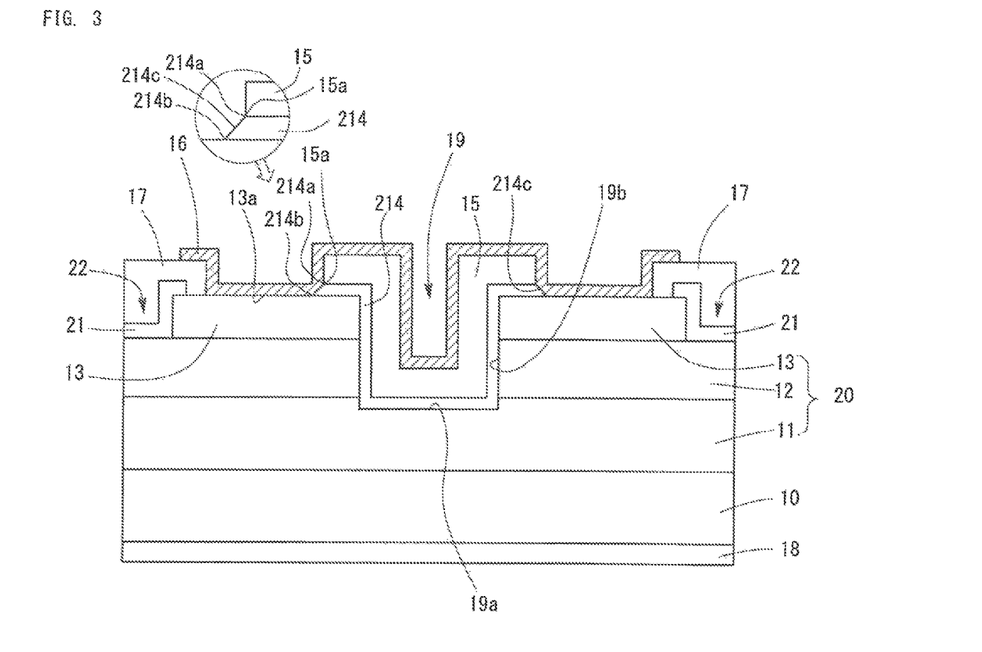
FIG. 3 shows the structure of a semiconductor device according to variation 1 of Embodiment 1.

FIG. 3 shows the structure of a semiconductor device according to variation 1 of Embodiment 1. The semiconductor device according to variation 1 of Embodiment 1 shown in FIG. 3 has a structure in which a gate insulating film 214 is formed in place of the gate insulating film 14 of the semiconductor device according to Embodiment 1. Others are same as Embodiment 1.

The gate insulating film 214 is made of ZrON having a dielectric constant higher than that of the passivation film 16. The ends 214a of the top surface of the gate insulating film 214 are formed aligned with the ends 15a of the bottom surface of the gate electrode, and the ends 214b of the bottom surface of the gate insulating film 214 are formed between 0 μm to 1 μm outside the gate electrode 15 (in a direction of the source electrode 17 as viewed from the gate electrode 15). The side surfaces 214c at the ends of the gate insulating film 214 are inclined, and the inclination angle is in a range of 0° to 60° with respect to a direction perpendicular to the top surfaces 13a of the second n-type layer 13 (the top surfaces of the trench 19) in contact with the bottom surface at the ends of the gate insulating film 214. For convenience, the forward tapered inclination angle is defined as a positive value, and the reversed tapered inclination angle is defined as a negative value.

The gate insulating film 214 is made of ZrON. However, any other insulating material may be used, for example, $ZrO_2$, $HfO_2$, SiN, ZrON, SiON, $Al_2O_3$, AlN, AlON, and others.

Variation 2 of Embodiment 1

Figure 4:
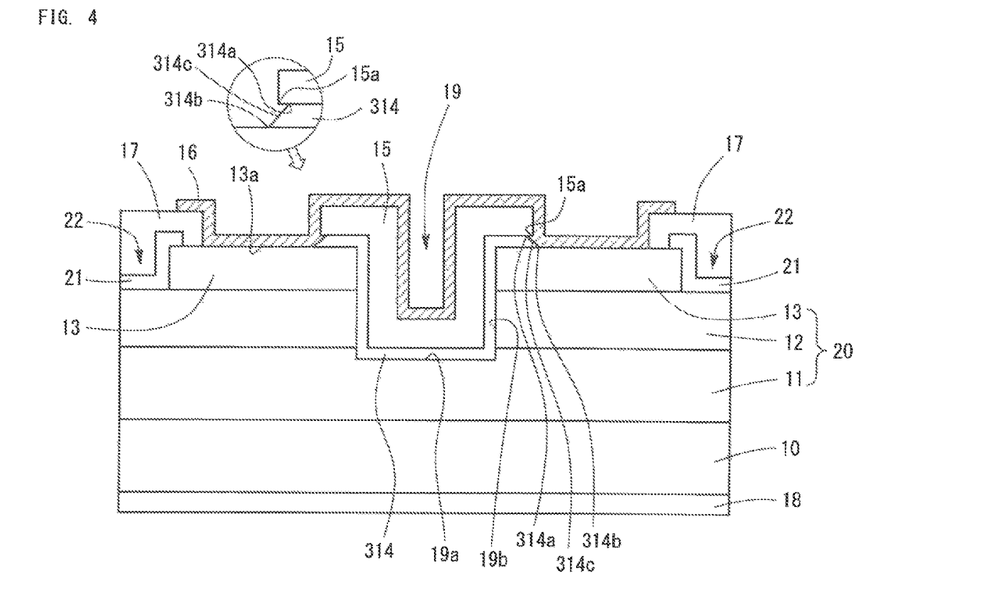
FIG. 4 shows the structure of a semiconductor device according to variation 2 of Embodiment 1.

FIG. 4 shows the structure of a semiconductor device according to another variation of Embodiment 1. The semiconductor device according to variation 2 of Embodiment 1 shown in FIG. 4 has a structure in which a gate insulating film 314 is formed in place of the gate insulating film 14. Others are same as Embodiment 1.

The ends 314a of the top surface of the gate insulating film 314 are formed inside the ends 15a of the bottom surface of the gate electrode, the ends 314b of the bottom surface of the gate insulating film 314 are formed between 0 μm to 1 μm outside the gate electrode 15. The side surfaces 314c at the ends of the gate insulating film 314 are inclined, and the inclination angle is in a range of 0° to 60° with respect to a direction perpendicular to the top surfaces 13a of the second n-type layer 13 (the top surfaces of the trench 19) in contact with the bottom surface at the ends of the gate insulating film 314. The gate insulating film 314 is made of $SiO_2$.

Embodiment 2

Figure 5:
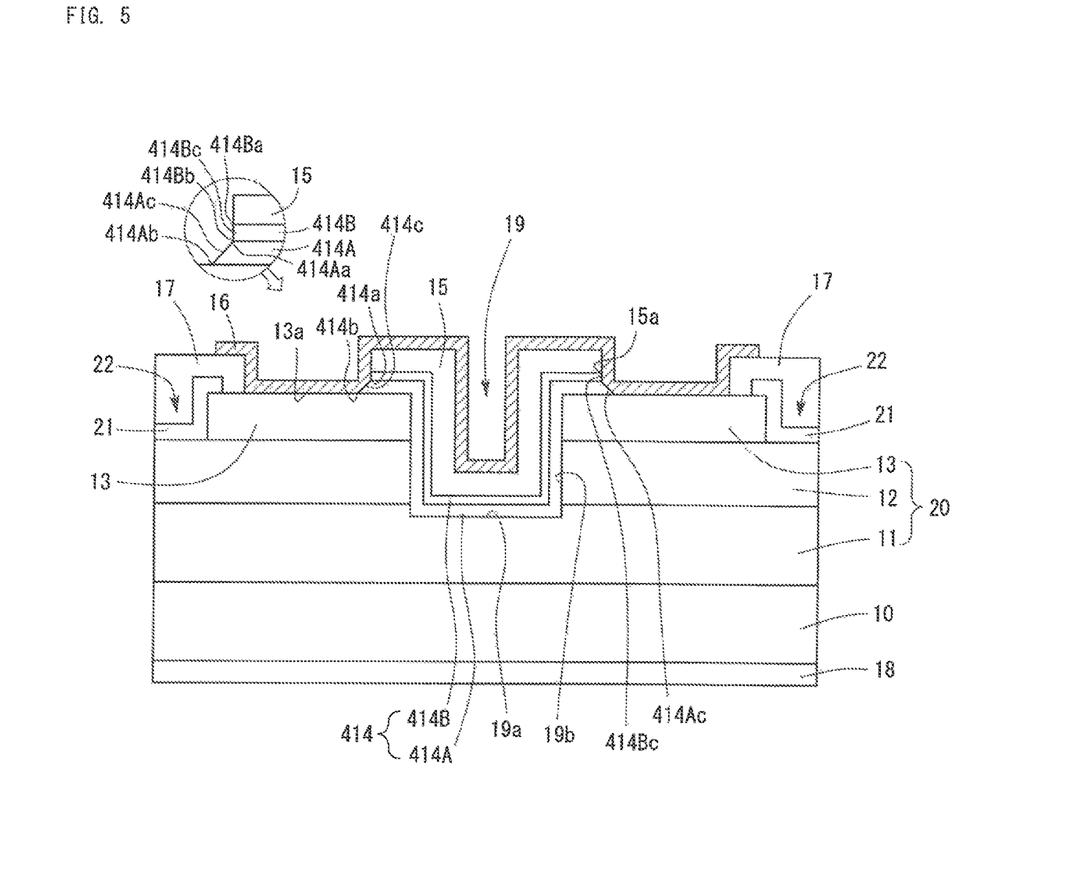
FIG. 5 shows the structure of a semiconductor device according to Embodiment 2.

FIG. 5 shows the structure of a semiconductor device according to Embodiment 2. The semiconductor device according to Embodiment 2 shown in FIG. 5 has a structure in which a gate insulating film 414 is formed in place of the gate insulating film 14 of the semiconductor device according to Embodiment 1. Others are same as Embodiment 1.

The gate insulating film 414 comprises two layers 414A and 414B. The layer 414A in contact with the second n-type layer 13 is made of $SiO_2$, the layer 414B in contact with the gate electrode 15 is made of ZrON. Thereby, damage to the semiconductor layer during film formation is reduced, and the effective dielectric constant of the gate insulating film 414 can be changed. The gate insulating film 414 may have a multi-layer structure comprising two or more layers. Other material may be used, for example, $SiO_2$/ZrON, $SiO_2$/$Al_2O_3$, $SiO_2$/$HfO_2$, $SiO_2$/$ZrO_2$, $SiO_2$/AlON, and others. The symbol "/" means depositing, and A/B means a layered structure in which a layer of A is first formed and a layer of B is then formed. The symbol "/" will be used in the same meaning in the description of materials provided below. When the gate insulating film has a multi-layer structure, dielectric constant of the gate insulating film means effective dielectric constant of the whole gate insulating film in the specification.

The ends 414Ba of the top surface of the upper layer 414B of the gate insulating film 414 are aligned with the ends 15a of the bottom surface of the gate electrode 15, and the ends 414Ab of the bottom surface the lower layer 414A of the gate insulating film 414 are disposed between 0 μm to 1 μm outside the gate electrode 15. Moreover, the ends 414Aa of the top surface of the lower layer 414A of the gate insulating film 414 are aligned with the ends 414Bb of the bottom surface of the upper layer 414B. The side surfaces 414Bc at the ends of the upper layer 414B of the gate insulating film 414 are perpendicular to the top surfaces 13a of the second n-type layer 13 (the top surfaces of the trench 19) in contact with the ends of the lower layer 414A, the side surfaces 414Ac at the ends of the lower layer 414A of the gate insulating film 414 are inclined with respect to a direction perpendicular to the top surfaces 13a of the second n-type layer 13 (the top surfaces of the trench 19) in contact with the ends of the lower layer 414A. The inclination angle is in a range of 0° to 60° with respect to a direction perpendicular to the top surfaces 13a of the second n-type layer 13.

Variation 1 of Embodiment 2

Figure 6:
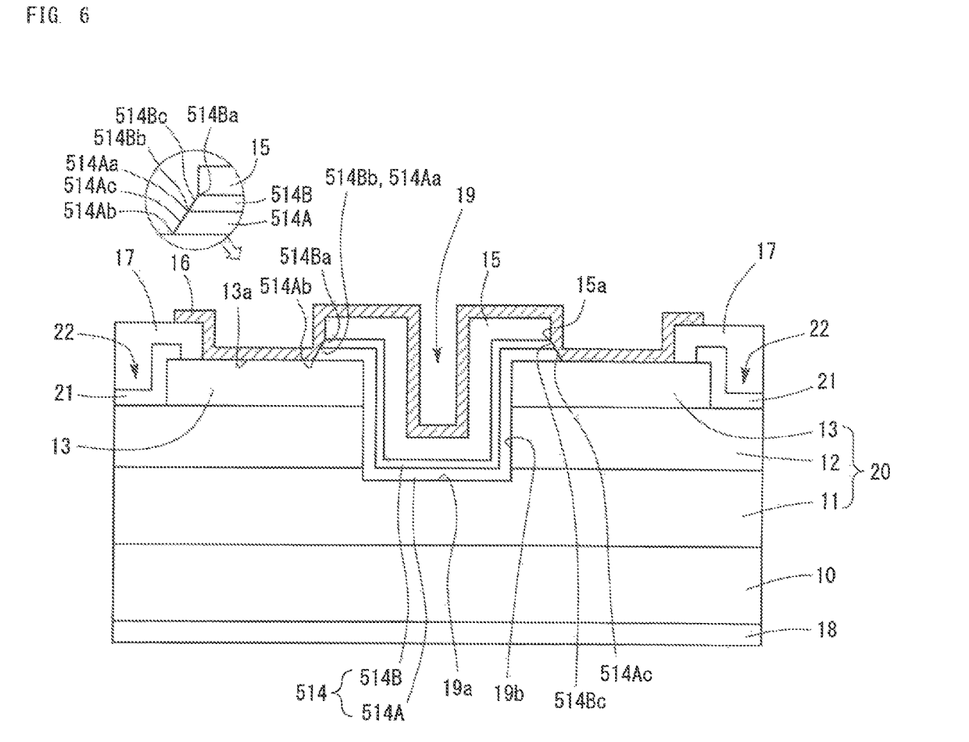
FIG. 6 shows the structure of a semiconductor device according to variation 1 of Embodiment 2.

FIG. 6 shows the structure of the semiconductor device according to variation 1 of Embodiment 2. As shown in FIG. 6, the semiconductor device according to variation 1 of Embodiment 2 has a structure in which a gate insulating film 514 is formed in place of the gate insulating film 414 shown in FIG. 5. Others are same as in FIG. 5.

As shown in FIG. 6, the gate insulating film 514 comprises two layers 514A and 514B as with the gate insulating film 414. The lower layer 514A in contact with the second n-type layer 13 is made of $SiO_2$, and the upper layer 514B in contact with the gate electrode 15 is made of ZrON. The gate insulating film 514 is different from the gate insulating film 414 in the end structure. The ends 514Ba of the top surface of the upper layer 514B of the gate insulating film 514 are aligned with the ends 15a of the bottom surface of the gate electrode 15. The ends 514Bb of the bottom surface of the upper layer 514B of the gate insulating film 514 are aligned with the ends 514Aa of the top surface of the lower layer 514A of the gate insulating film 514. The side surfaces 514Bc at the ends of the upper layer 514B are flush with the side surfaces 514Ac at the ends of the lower layer 514A, and the inclination angle of the side surfaces is in a range of 0° to 60° with respect to a direction perpendicular to the top surfaces 13a of the second n-type layer 13 (the top surfaces of the trench 19) in contact with the ends of the lower layer 514A. The ends 514Ab of the bottom surface of the lower layer 514A of the gate insulating film 514 are in contact with the second n-type layer 13 and disposed between 0 μm to 1 μm outside the gate electrode 15.

Variation 2 of Embodiment 2

Figure 7:
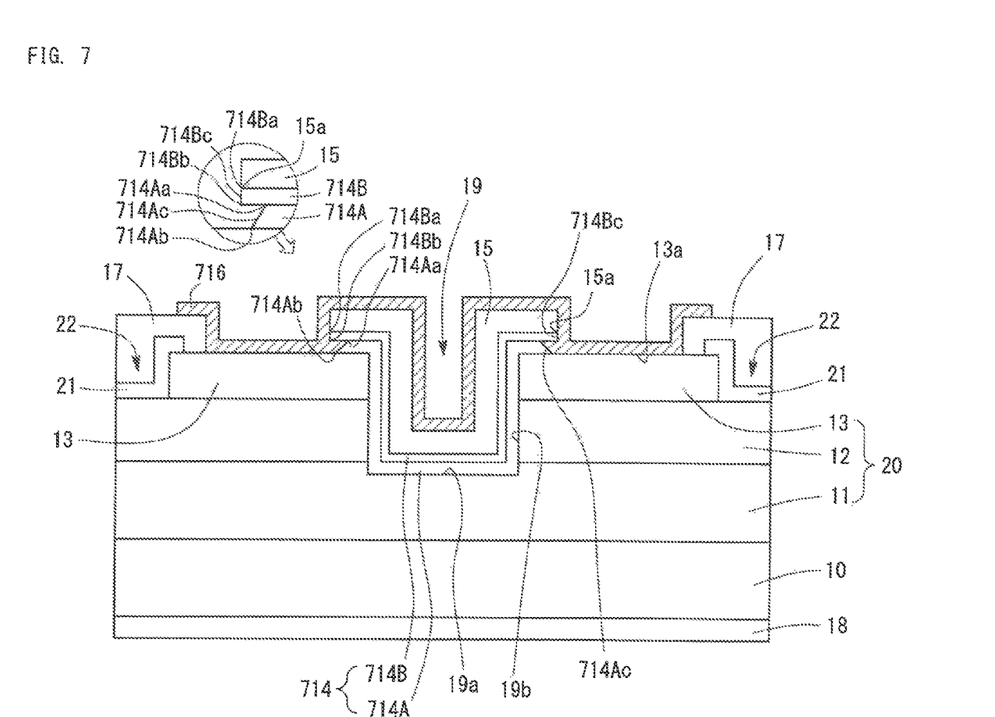
FIG. 7 shows the structure of a semiconductor device according to variation 2 of Embodiment 2.

FIG. 7 shows the structure of a semiconductor device according to variation 2 of Embodiment 2. As shown in FIG. 7, the semiconductor device according to variation 2 of Embodiment 2 has a structure in which a gate insulating film 714 and a passivation film 716 are formed in place of the gate insulating film 414 and the passivation film 16 shown in FIG. 5. Others are same as in FIG. 5.

As shown in FIG. 7, the gate insulating film 714 comprises two layers 714A and 714B as with the gate insulating film 414. The lower layer 714A in contact with the second n-type layer 13 is made of $SiO_2$, and the upper layer 714B in contact with the gate electrode 15 is made of ZrON. The gate insulating film 714 is different from the gate insulating film 414 in the end structure.

The ends 714Ba of the top surface and the ends 714Bb of the bottom surface of the upper layer 714B of the gate insulating film 714 are aligned with the ends 15a of the bottom surface of the gate electrode 15, and the side surfaces 714Bc at the ends of the upper layer 714B are perpendicular to the top surfaces 13a of the second n-type layer 13 (the top surfaces of the trench 19) in contact with the ends of the lower layer 714A.

The ends 714Aa of the top surface and the ends 714Ab of the bottom surface of the lower layer 714A of the gate insulating film 714 are disposed inside the ends 15a of the bottom surface of the gate electrode 15. Therefore, the lower layer 714A of the gate insulating film 714 is not formed on a part of the second n-type layer 13 facing the gate electrode 15, that is, there is a gap. The area where the lower layer 714A of the gate insulating film 714 is in contact with the second n-type layer 13 is smaller than the area where the second n-type layer 13 faces the gate electrode 15 via the gate insulating film 714, i.e., the orthogonal projection of the gate electrode 15. The side surfaces 714Ac at the ends of the lower layer 714A may be perpendicular or inclined to the top surfaces 13a of the second n-type layer 13 (the top surfaces of the trench 19) in contact with the ends of the lower layer 714A. The side surfaces 714Ac at the ends of the lower layer 714A may be in a range of −60° to 60° with respect to a direction perpendicular to the top surfaces 13a of the second n-type layer 13 in contact with the bottom surface at the ends of the lower layer 714A.

To position the ends 714Aa of the top surface and the ends 714Ab of the bottom surface of the lower layer 714A of the gate insulating film 714 inside the ends 15a of the bottom surface of the gate electrode 15, in etching of the gate insulating film 14 shown in FIG. 2E, the side etching may be performed for a longer time under the reactive isotropic etching condition in the case of dry etching, and for a longer time since the wet etching is originally isotropic in the case of wet etching.

The passivation film 716 covers the entire top surface of the device except the contact hole of the source electrode 17 as with the passivation film 16. However, the passivation film 716 is formed so as to fill the gap including a region where the second n-type layer 13 faces the above gate electrode 15 and the gate insulating film 714 is not formed. When the passivation film 716 is formed through ALD, such a gap can be filled with good reproducibility, thereby obtaining an amorphous film with uniform quality.

Embodiment 3

Figure 8:
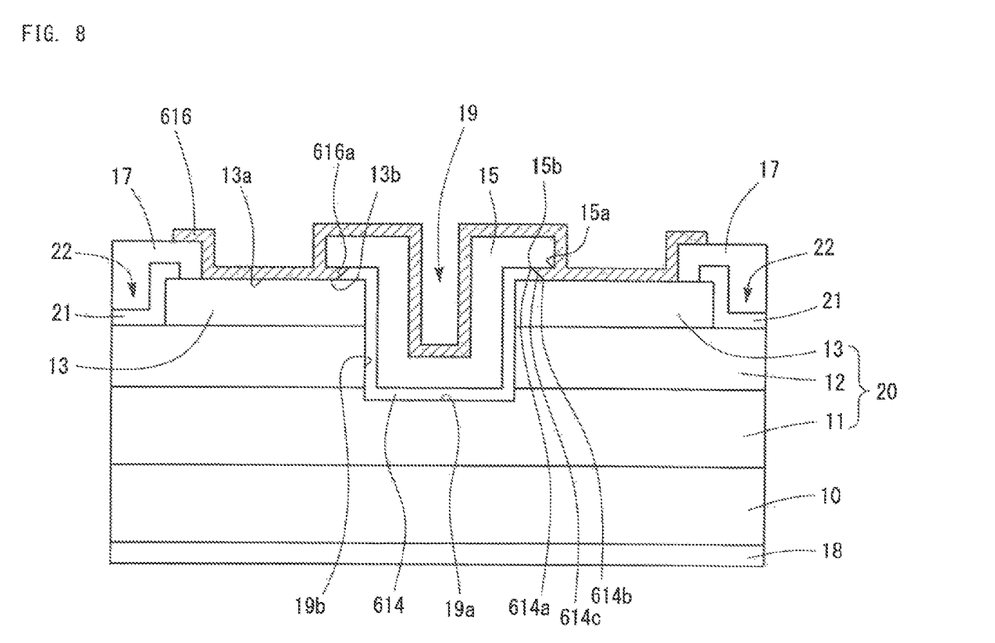
FIG. 8 shows the structure of a semiconductor device according to Embodiment 3.

FIG. 8 shows the structure of a semiconductor device according to Embodiment 3. The semiconductor device according to Embodiment 3, as shown in FIG. 8, has a structure in which a gate insulating film 614 and a passivation film 616 are formed in place of the gate insulating film 14 and the passivation film 16 in the semiconductor device according to Embodiment 1. Others are same as Embodiment 1.

In the gate insulating film 614, the ends 614a of the top surface and the ends 614b of the bottom surface are disposed in different positions from the ends 14a and 14b in the gate insulating film 14, and others are same as the gate insulating film 14. The ends 614a of the top surface and the ends 614b of the bottom surface of the gate insulating film 614 are disposed inside the ends 15a of the bottom surface of the gate electrode 15, as shown in FIG. 8. Therefore, there is a gap including a region where the second n-type layer 13 faces the gate electrode 15 and the gate insulating film 614 is not formed. The area where the gate insulating film 614 is in contact with the second n-type layer 13 is smaller than the area where the second n-type layer 13 faces the gate electrode 15 via the gate insulating film 614, i.e., the orthogonal projection of the gate electrode 15. The side surfaces 614c at the ends of the gate insulating film 614 may be perpendicular or inclined to the top surfaces 13a of the second n-type layer 13 (the top surfaces of the trench 19) in contact with the bottom surface at the ends of the gate insulating film 614. The inclination angle may be in a range of −60° to 60° with respect to a direction perpendicular to the top surfaces 13a of the second n-type layer 13.

To position the ends 614a of the top surface and the ends 614b of the bottom surface of the gate insulating film 614 inside the ends 15a of the bottom surface of the gate electrode 15, etching may be performed in the same way as in variation 2 of Embodiment 2.

The passivation film 616 covers the entire top surface of the device except the contact hole of the source electrode 17 as with the passivation film 16. However, the passivation film 616 is formed so as to fill the gap 616a including a region where the second n-type layer 13 faces the gate electrode 15 and the gate insulating film 614 is not formed. Others such as material of the passivation film 616 are same as the passivation film 16 of Embodiment 1.

In the semiconductor device according to Embodiment 3, since the ends 614a of the top surface and the ends 614b of the bottom surface of the gate insulating film 614 are disposed inside the ends 15a of the bottom surface of the gate electrode 15, the exposed surface of the second n-type layer 13 is larger than in the semiconductor device according to Embodiment 1. Therefore, the area where the passivation film 616 is in contact with the second n-type layer 13 is larger than in the semiconductor device according to Embodiment 1, thereby further suppressing current leakage caused by the surface level generated on the surface of the second n-type layer 13.

The ends 614a of the top surface and the ends 614b of the bottom surface of the gate insulating film 614 may be disposed inside to any extent from the ends 15a of the gate electrode 15. However, to improve the effect of suppressing current leakage, the ends 614b of the bottom surface of the gate insulating film 614 is preferably disposed inside to a possible extent from the ends 15a of the gate electrode 15. However, the ends 614b of the bottom surface of the gate insulating film 614 is disposed excessively inside the ends 15a of the gate electrode 15, the gate electrode 15 may be in direct contact with the second n-type layer 13 when etching the gate insulating film 614, resulting in a short circuit between the gate electrode 15 and the source electrode 17, which is not desirable.

For example, an area S outside the channel (the region of the p-type layer 12 in the semiconductor device according to Embodiment 3) of the surface where the gate insulating film 614 is in contact with the semiconductor layer 20 is preferably as small as possible to suppress current leakage. Therefore, the area S is preferably 90% or less of the area S0 where the gate electrode 15 faces the semiconductor layer 20 via the gate insulating film 614 and the passivation film 616 of the area where the semiconductor layer 20 is in contact with the gate insulating film 614 and the passivation film 616. The area S is, more preferably, 50% or less, and further preferably, 30% of the area S0. In terms of suppressing current leakage, the area S is most preferably, 0% (that is, the channel part coincides with the region of the gate insulating film 614). However, the area S is too small, the gate insulating film 614 is difficult to be formed so as to cover the entire region of the channel part, thereby increasing the possibility that the gate electrode 15 comes in contact with the second n-type layer 13. Therefore, to balance the easiness of production and the suppression of current leakage, the area S is preferably 10% or more of the area S0 where the semiconductor layer 20 faces the gate electrode 15 via the gate insulating film 614 and the passivation film 616.

Variation of Embodiment 3

A semiconductor device according to variation of Embodiment 3 is different in that the passivation film 616 is made of a material different from that of the semiconductor device according to Embodiment 3. Others are same as Embodiment 3. The material of the passivation film 616 has a dielectric constant lower than that of the gate insulating film 614. For example, SiOF, SiOC, and others may be used. SiOF is preferably used in terms of easiness of production or film quality, and low dielectric constant.

In the semiconductor device according to variation of Embodiment 3, current leakage caused by the surface level generated on the surface of the second n-type layer 13 is suppressed in the same way as the semiconductor device according to Embodiment 3.

Moreover, electric field concentration is relaxed at the ends 15a of the bottom surface of the gate electrode 15 for the following reason. Since the passivation film 616 is made of a material having a dielectric constant lower than that of the gate insulating film 614, electric field is also concentrated at the regions 15b of the gate electrode 15 in contact with the ends 614a of the top surface of the gate insulating film 614. Thus, the electric field is concentrated in two places: the ends 15a of the bottom surface and the regions 15b of the gate electrode 15. Therefore, the electric field concentration is dispersed, resulting in relaxation of the electric field concentration at the ends 15a of the bottom surface of the gate electrode 15.

To further relax the electric field concentration at the ends 15a of the bottom surface of the gate electrode 15, the passivation film 616 is made of a material having a dielectric constant as low as possible. The dielectric constant is preferably 1 to 3.8, more preferably, 2 to 3.7, and further preferably, 3 to 3.5.

Embodiment 4

Semiconductor devices according to Embodiments 1 to 3 have a vertical conductive structure with respect to a direction perpendicular to the main surface of the substrate. The present invention is also applicable to a horizontal conductive structure in a direction parallel to the main surface of the substrate.

Figure 9:
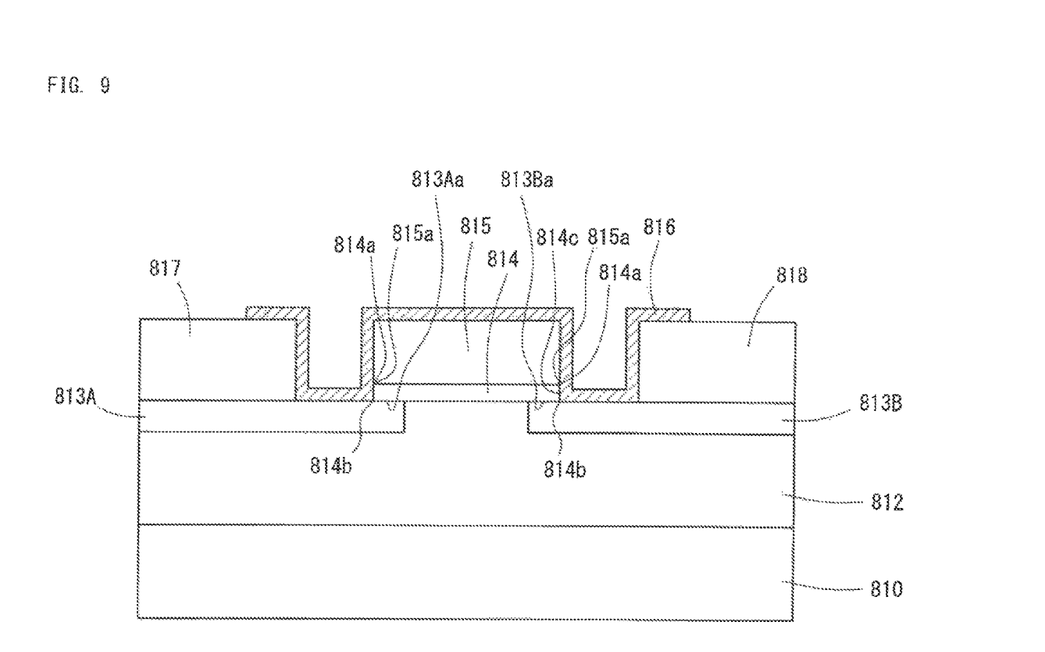
FIG. 9 shows the structure of a semiconductor device according to Embodiment 4.

FIG. 9 shows an example of a semiconductor device according to Embodiment 4 where the present invention is applied to a planar gate horizontal type structure. The semiconductor device according to Embodiment 4 has a Si substrate 810, and a Mg-doped p-type layer 812 made of p-GaN formed via a buffer layer (not illustrated) comprising an AlN layer and an undoped GaN layer sequentially deposited on the substrate 810. The n-type layers 813A and 813B are separately formed by Si ion implantation on a part of the surface of the p-type layer 812.

A gate insulating film 814 is continuously formed in contact with the end on the p-type layer 812 side on the n-type layer 813A, the p-type layer 812 between the n-type layers 813A and 813B, and the end on the p-type layer 812 side on the n-type layer 813B. A gate electrode 815 is formed on the gate insulating film 814. As shown in FIG. 9, the ends 815a of the bottom surface of the gate electrode 815 on the n-type layer 813A are aligned with the ends 814a of the top surface of the gate insulating film 814, and the ends 814b of the bottom surface of the gate insulating film 814 are formed in contact with the surface of the n-type layer 813A facing the ends 815a of the bottom surface of the gate electrode 815. The ends 815a of the bottom surface of the gate electrode 815 on the n-type layer 813B are aligned with the ends 814a of the top surface of the gate insulating film 814, and the ends 814b of the bottom surface of the gate insulating film 814 are formed in contact with the surface of the n-type layer 813B facing the ends 815a of the bottom surface of the gate electrode 815. The side surfaces 814c at the ends of the gate insulating film 814 are perpendicular to the top surfaces 813Aa and 813Ba of the n-type layers 813A and 813B in contact with the bottom surface at the ends of the gate insulating film 814.

A source electrode 817 is formed on the n-type layer 813A, and a drain electrode 818 is formed on the n-type layer 813B. The passivation film 816 covers the entire top surface of the device except the contact holes of the gate electrode 815, the source electrode 817, and the drain electrode 818. The passivation film 816 is made of the same material as the passivation film 16, which has a dielectric constant higher than that of the gate insulating film 814.

In the semiconductor device according to Embodiment 4 shown in FIG. 9, the effect of suppressing current leakage and the effect of relaxing electric field concentration at the ends 815a of the bottom surface of the gate electrode 815 are also obtained as in the semiconductor device according to Embodiment 1.

Variation 1 of Embodiment 4

The semiconductor device according to Embodiment 4 has a horizontal planar gate structure. However, the semiconductor device according to Embodiment 4 is also applicable to a semiconductor device having a horizontal trench gate structure in which the gate insulating film and the gate electrode are deposited on the semiconductor layer having a trench thereon.

Figure 10:
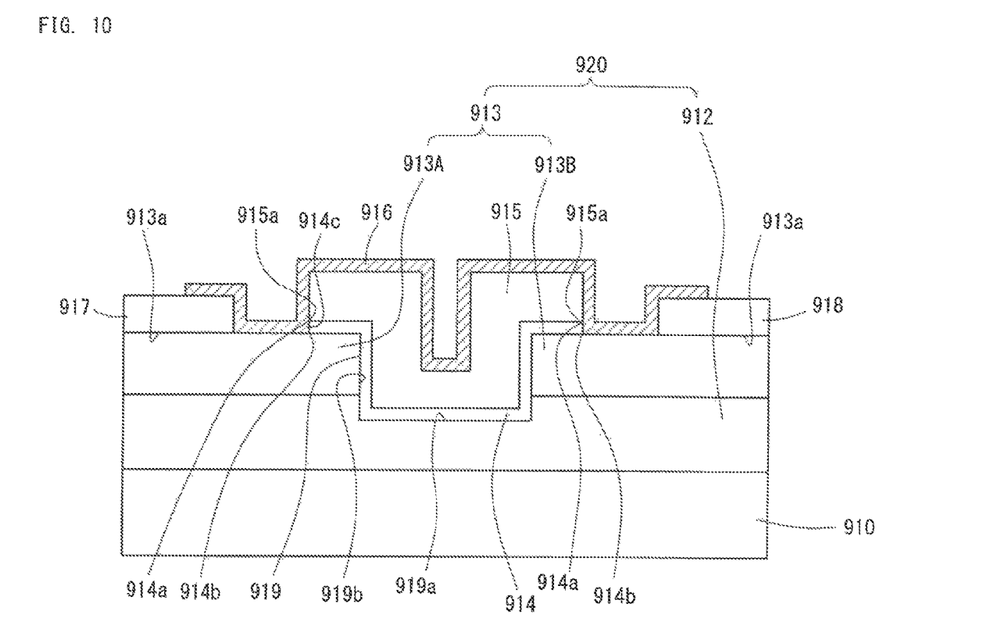
FIG. 10 shows the structure of a semiconductor device according to variation 1 of Embodiment 4.

FIG. 10 shows an example of a semiconductor device according to variation 1 of Embodiment 4, in which the present invention is applied to a horizontal trench gate structure. The semiconductor device according to variation 1 of Embodiment 4 has a Si substrate 910, a buffer layer (not illustrated) comprising an AlN layer and an undoped GaN layer sequentially deposited on the substrate 910, and a semiconductor layer 920 comprising a p-type layer 912 and an n-type layer 913 sequentially deposited. The p-type layer 912 is made of p-GaN doped with Mg, and the n-type layer 913 is made of n-GaN doped with Si or implanted with Si ions.

A trench formed at a predetermined position of the semiconductor layer 920 is a trench 919 which has a depth passing through the n-type layer 913 and reaching the p-type layer 912. The n-type layer 913 is separated into two regions 913A and 913B by the trench 919. The p-type layer 912 is exposed on the bottom surface 919a of the trench 919, and the p-type layer 912, the n-type layers 913A and 913B are exposed on the side surfaces 919b of the trench 919.

The gate insulating film 914 is made of $SiO_2$, and continuously formed in a film on the bottom surface 919a of the trench 919, the side surfaces 919b of the trench 919, the top surfaces 913a of the n-type layer 913 in the vicinity of the side surfaces 919b of the trench 919. As shown in FIG. 10, the ends 915a of the bottom surface of the gate electrode 915 are aligned with the ends 914a of the top surface of the gate insulating film 914. Moreover, the ends 914b of the bottom surface of the gate insulating film 914 are formed in contact with the surfaces of the n-type layer 913 facing the ends 915a of the bottom surface of the gate electrode 915. The side surfaces 914c at the ends of the gate insulating film 914 are perpendicular to the top surfaces 913a of the n-type layer 913 (the top surfaces of the trench 919) in contact with the bottom surface at the ends of the gate insulating film 914.

A source electrode 917 is formed on the n-type layer 913A, and a drain electrode 918 is formed on the n-type layer 913B. The passivation film 916 covers the entire top surface of the device except the contact holes of the gate electrode 915, the source electrode 917, and the drain electrode 918. The passivation film 916 is made of the same material as the passivation film 16, which has a dielectric constant higher than that of the gate insulating film 914.

In the semiconductor device according to variation 1 of Embodiment 4 shown in FIG. 10, the effect of suppressing current leakage and the effect of relaxing electric field concentration at the ends 915a of the bottom surface of the gate electrode 915 are also obtained as in the semiconductor device according to Embodiment 1.

Variation 2 of Embodiment 4

Figure 11:
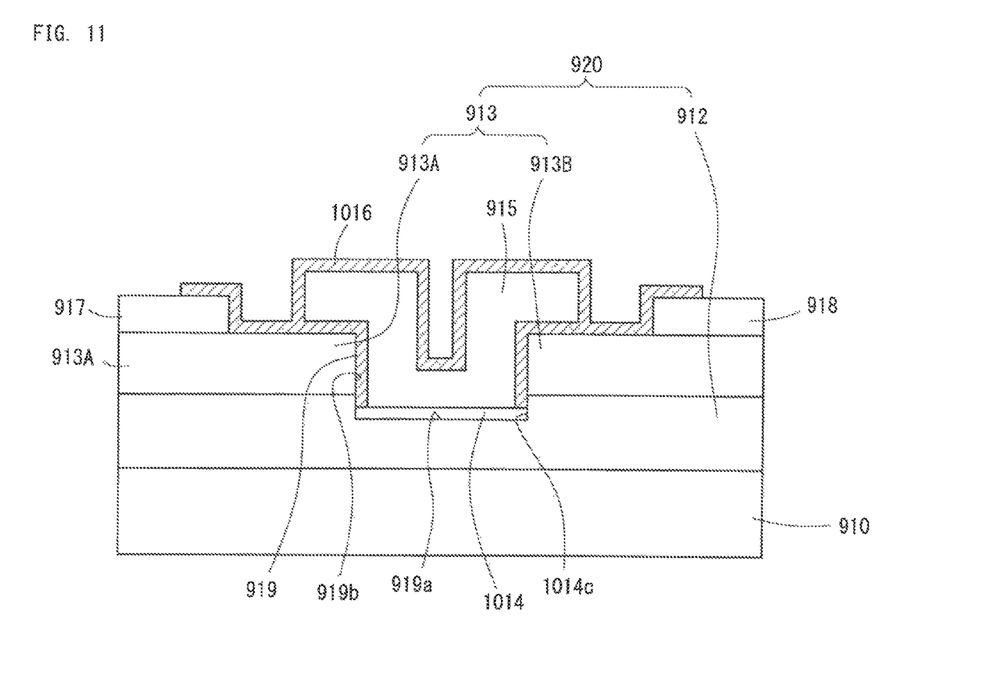
FIG. 11 shows the structure of a semiconductor device according to variation 2 of Embodiment 4.

FIG. 11 shows the structure of a semiconductor device according to variation 2 of Embodiment 4, which has another horizontal trench gate structure. The semiconductor device according to variation 2 of Embodiment 4 is of a horizontal type as shown in FIG. 11, and has a structure in which a gate insulating film 1014 and a passivation film 1016 are formed in place of the gate insulating film 914 and the passivation film 916 in the semiconductor device according to variation 1 of Embodiment 4. Others are same as the semiconductor device according to variation 1 of Embodiment 4 having a horizontal trench gate structure shown in FIG. 10.

In FIG. 11, a gate insulating film 1014 is remained on only a part above the bottom surface 919a of the trench 919, and other part (a gap part between the gate electrode 915 and the n-type layers 913A and 913B) is filled with the passivation film 1016. The gate insulating film 1014 is made of $SiO_2$, and the passivation film 1016 is made of $Al_2O_3$. The side surfaces 1014c at the ends of the gate insulating film 1014 are perpendicular to the surface of the layer 912 in contact with the bottom surface at the ends of the gate insulating film 1014 (the bottom surface 919a of the trench 919).

In FIG. 11, the area where the passivation film 1016 is in contact with the n-type layer 913 is more increased and the effect of suppressing current leakage is more improved than in the semiconductor device according to variation 1 of Embodiment 4 having a horizontal trench gate structure shown in FIG. 10.

Variations

The present invention includes the case where the ends of the bottom surface of the gate insulating film are disposed outside the ends of the bottom surface of the gate electrode in one region, and the ends of the bottom surface of the gate insulating film are disposed inside the ends of the bottom surface of the gate electrode in the other region.

The semiconductor device according to Embodiments 1 to 4 is a MOSFET. However, the present invention is not limited to a MOSFET, and may be applied to any semiconductor device having a gate insulating film and a gate electrode, such as IGBT and HFET.

In the semiconductor device according to Embodiments 1 to 4, Group III nitride semiconductor is used as a semiconductor layer. However, the present invention is not limited to this, and may be applied to a semiconductor device using any semiconductor material, for example, SiC, Si, SiGe, and Group III-V semiconductor material. The present invention is suitable for the case of using Group III nitride semiconductor or SiC, particularly for the case of using Group III nitride semiconductor because leakage current caused by surface level is remarkable in such materials.

As shown in Embodiments or Variations, as long as the ends of the top surface of the gate insulating film are in contact with the bottom surface of the gate electrode, the side surfaces at the ends of the gate insulating film are not necessarily perpendicular to and may be inclined to the surface of the semiconductor layer in contact with the bottom surface at the ends of the gate insulating film. In other words, the side surfaces at the ends of the gate insulating film are in a range of −60° to 60° with respect to a direction perpendicular to the surface of the semiconductor layer in contact with the bottom surface at the ends of the gate insulating film. The surface of the semiconductor layer in contact with the bottom surface at the ends of the gate insulating film is, for example, the bottom surface of the trench when the ends of the gate insulating film are on the bottom surface of the trench, the side surfaces of the trench when the ends of the gate insulating film are on the side surfaces of the trench, and the top surfaces of the trench when the ends of the gate insulating film are on the top surfaces of the trench. Variation 2 of Embodiment 4 is an example of the case where the ends of the gate insulating film are on the bottom surface of the trench, and other Embodiments and Variations are examples of the case where the ends of the gate insulating film are on the top surfaces of the trench. However, the inclination angle of the side surfaces at the ends is set in a range of −60° to 60°, preferably, −45° to 45°, and more preferably, −30° to 30°. It is because the area where the passivation film is in contact with the surface of the semiconductor layer is sufficiently increased, thereby reducing current leakage. When the inclination angle of the side surfaces at the ends changes, the average inclination angle may be in a range of −60° to 60°. When the gate insulating film comprises two or more layers, the inclination angle of the side surfaces at the ends of each layer may be any value as long as it is in a range of −60° to 60°.

The semiconductor device of the present invention may be applied to a power device and others.

What is claimed is:

1. A semiconductor device comprising:
    a semiconductor layer;
    a gate insulating film formed on a first region of a surface of the semiconductor layer, the gate insulating film comprising a top surface having a first side end edge and a bottom surface having a second side end edge, and the bottom surface being contacted with the surface of the semiconductor layer;
    a gate electrode formed on the top surface of the gate insulating film;
    an electrode formed apart from the gate electrode on a second region of the surface of the semiconductor layer; and
    a passivation film formed on at least a third region of the surface of the semiconductor layer, the third region being a region other than the first region and the second region, the passivation film contacting with a side surface, formed by the first side end edge and the second side end edge, of the gate insulating film and the passivation film being made of an insulating material different from a material of the gate insulating film,
    wherein the first side end edge of the top surface of the gate insulating film is in contact with a bottom surface of the gate electrode, and the side surface of the gate insulating film is in a range of −60° to 60° with respect to a direction perpendicular to the top surface of the gate insulating film.

2. The semiconductor device according to claim 1, wherein the passivation film is made of a material having a dielectric constant higher than the material of the gate insulating film.

3. The semiconductor device according to claim 2, wherein the gate insulating film is made of $SiO_2$, and the passivation film is made of at least one selected from a group consisting of ZrON, AlON, $HfO_2$ and HfON.

4. The semiconductor device according to claim 1, wherein the passivation film is made of a material having a dielectric constant lower than the material of the gate insulating film.

5. The semiconductor device according to claim 4, wherein the gate insulating film is made of $SiO_2$, and the passivation film is made of SiOF or SiOC.

6. The semiconductor device according to claim 1, wherein the second side end edge of the bottom surface of the gate insulating film is disposed inside a side end edge of the bottom surface of the gate electrode.

7. The semiconductor device according to claim 1, wherein an area of the bottom surface of the gate insulating film which is outside a channel is 90% or less of an area of an orthogonal projection of the gate electrode to the surface of the semiconductor layer.

8. The semiconductor device according to claim 1, wherein the second side end edge of the bottom surface of the gate insulating film is disposed outside a side end edge of the bottom surface of the gate electrode.

9. The semiconductor device according to claim 1, wherein the semiconductor device has a trench gate structure, the surface of the semiconductor layer has a trench, and the gate insulating film is formed on a side surface or a bottom surface of the trench.

10. The semiconductor device according to claim 1, wherein the semiconductor device has a vertical type structure, and electrical conduction is established with respect to a direction perpendicular to a main surface of the semiconductor layer.

11. The semiconductor layer according to claim 1, wherein the semiconductor layer is made of Group III nitride semiconductor.

12. The semiconductor device according to claim 1, wherein the passivation film is continuously formed on a top surface and a side surface of the gate electrode from the third region.

13. The semiconductor device according to claim 8, wherein the passivation film is formed on a top surface and a side surface of the gate electrode.

14. The semiconductor device according to claim 1, wherein the gate insulating film comprises a double layer structure.

15. The semiconductor device according to claim 8, wherein the gate insulating film comprises a double layer structure.

16. The semiconductor device according to claim 8, wherein an another gate insulating film is formed on the gate insulating film, a side surface of the another gate insulating film coincides with a side surface of the gate electrode.

* * * * *